United States Patent [19]

Hamakawa et al.

[11] Patent Number: 4,735,396
[45] Date of Patent: Apr. 5, 1988

[54] SUBSTRATE FOR MANUFACTURING SINGLE CRYSTAL THIN FILMS

[75] Inventors: Yoshihiro Hamakawa, 17-4, Minamihanayashiki 3-chome, Kawanishi-shi, Hyogo-ken; Hideyuki Takakura, Osaka, both of Japan

[73] Assignee: Yoshihiro Hamakawa, Hyogo, Japan

[21] Appl. No.: 732,855

[22] Filed: May 10, 1985

Related U.S. Application Data

[62] Division of Ser. No. 543,452, Oct. 18, 1983, abandoned.

[30] Foreign Application Priority Data

Nov. 17, 1982 [JP] Japan .................... 57-202298

[51] Int. Cl.⁴ .............................................. C03C 25/06
[52] U.S. Cl. .................................. 249/60; 156/647; 156/657; 156/668; 156/DIG. 88; 264/293; 428/641
[58] Field of Search ............... 156/617 R, 603, 624, 156/662, 647, 668, DIG. 65, DIG. 88, 657; 428/13, 156, 167, 641, 162, 612; 264/293; 249/60; 422/245, 246, 251

[56] References Cited

U.S. PATENT DOCUMENTS

| | | | |
|---|---|---|---|
| 4,096,025 | 6/1978 | Caslavsky et al. | 156/DIG. 65 |
| 4,204,599 | 5/1980 | Dunn | 428/13 X |
| 4,218,283 | 8/1980 | Saiki et al. | 156/668 X |
| 4,229,474 | 10/1980 | Harrington | 428/167 X |
| 4,303,463 | 12/1981 | Cook | 156/DIG. 88 |
| 4,333,792 | 6/1982 | Smith | 156/DIG. 88 |
| 4,350,561 | 9/1982 | Little | 156/624 |
| 4,371,421 | 2/1983 | Fan et al. | 156/617 R X |
| 4,461,670 | 7/1984 | Celler et al. | 156/DIG. 88 |

FOREIGN PATENT DOCUMENTS 48-34069 10/1973 Japan .................... 156/DIG. 65

OTHER PUBLICATIONS

Distler et al, "Growth of Single Crystals Through Interfacial Layers", *Journal of Crystal Growth*, vol. 26, 1974, No. 1, pp. 21–26.

*Primary Examiner*—Richard L. Chiesa
*Attorney, Agent, or Firm*—Wenderoth, Lind & Ponack

[57] ABSTRACT

The invention is directed to a substrate for manufacturing single crystal thin films, wherein the substrate is a replica pattern of a monocrystalline or single crystal cleavage plane. Such replica pattern may be formed by pressing a material in a softened state against the cleavage plane of the single crystal, with subsequent hardening, and also, by subjecting the single crystal cleavage plane to vapor deposition or plating, and thereafter removing the formed layer from the single crystal cleavage plane.

2 Claims, 5 Drawing Sheets (111) plane

SUBSTRATE FOR MANUFACTURING SINGLE CRYSTAL THIN FILMS

This application is a division of Ser. No. 543,452 filed Oct. 18, 1983, now abandoned.

BACKGROUND OF THE INVENTION

1. Field of the Invention

The present invention relates to a novel substrate for manufacturing single crystal thin films.

2. Description of Prior Art

Recently, there has been an increasing demand for large area thin films and single crystals in the form of a thin plate for applications relating to solar cells, imaging sensors, ultra-large scale integrated circuits and electroluminescence displays, etc. In the semi-conductors and dielectric materials which are currently employed as electronic circuit elements and display devices, a large single crystal is once grown from a seed crystal so as to be formed into a thin-plate configuration by sawing for practical uses. Concerning Si crystal which has been widely employed as an electronic circuit element, functional devices such as transistors, diodes, etc. are fabricated in a position only 10 to 20 $\mu$m deep from the surface of the substrate. However, the actual thickness of the substrate is in the range of 300 to 400 $\mu$m for convenience in the processing steps. This means that more than 95% of the thickness of the expensive single crystal substrate is used merely for supporting purpose, and a thickness only less than 5% is alloted for the functional devices.

Accordingly, the object of the present invention is to provide an improved substrate for manufacturing single crystal thin films, which is capable of growing single crystal thin films of large area at high purity with the thickness necessary for functional devices, etc.

SUMMARY OF THE INVENTION

In accomplishing the above object, there is provided a novel substrate for manufacturing single crystal thin films according to the present invention. The single crystal thin film manufacturing substrate of the present invention is a replica pattern of a single crystal cleavage plane or surface, and such replica pattern is prepared by pressing a material in a softened state against the cleavage plane of a single crystal, with subsequent hardening, and also, by subjecting the cleavage plane of the single crystal to vapor deposition or plating, and subsequently removing the formed layer from the single crystal cleavage plane.

According to the present invention, since it is so arranged that the single crystal thin film is formed on a substrate which is a replica of a single crystal cleavage plane, it becomes possible to produce single crystal thin films of large area for wide application to various extremely large and important fields of electronic techniques, in which the large area single crystal thin films are required in large amounts.

DESCRIPTION OF PREFERRED EMBODIMENTS

Figure 1:
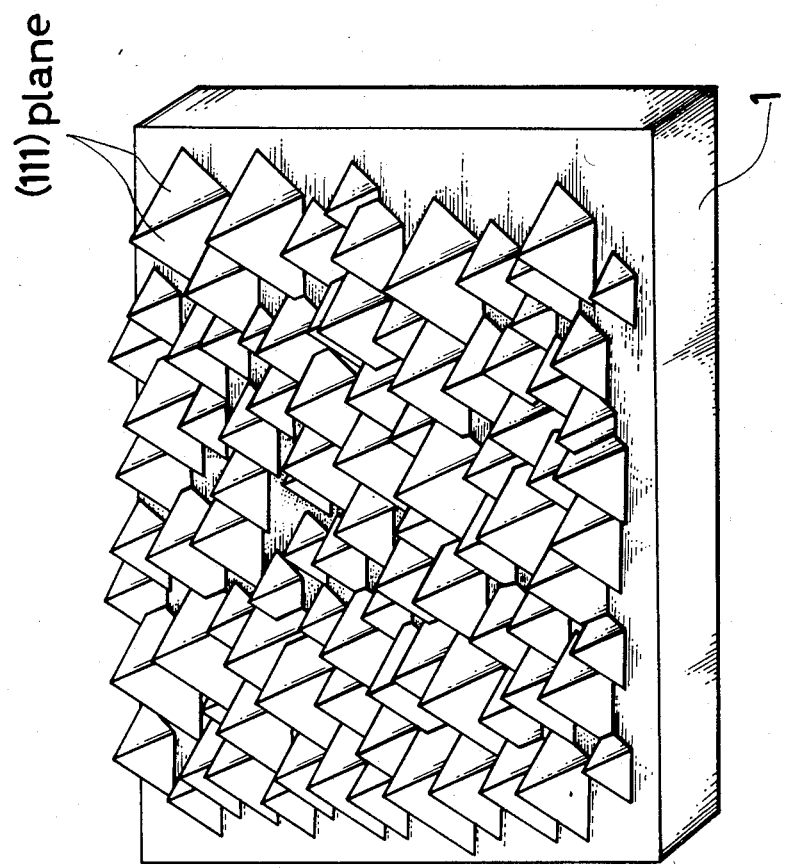
FIG. 1 is a perspective view of an original plate 1 to be used for manufacturing a substrate 2 according to one preferred embodiment of the present invention.

Referring now to the drawings, one preferred embodiment of the present invention will be described hereinbelow. In order to produce a substrate for manufacturing single crystal thin films according to the present invention, a silicon single crystal wafer having a (100) surface is prepared by the conventional method. Subsequently, the wafer having the (100) surface is subjected to anisotropic etching, and an original plate 1 as shown in FIG. 1 is produced. Each surface of the original plate 1 is a (111) plane which is a cleavage plane of the slowest etching rate. The etching solution for effecting such anisotropic etching may be, for example, hydrazine hydrate, NaOH, KOH, or a mixture of ethylenediamine and pyrocatechol, or may be a solution having another composition.

Figure 2:
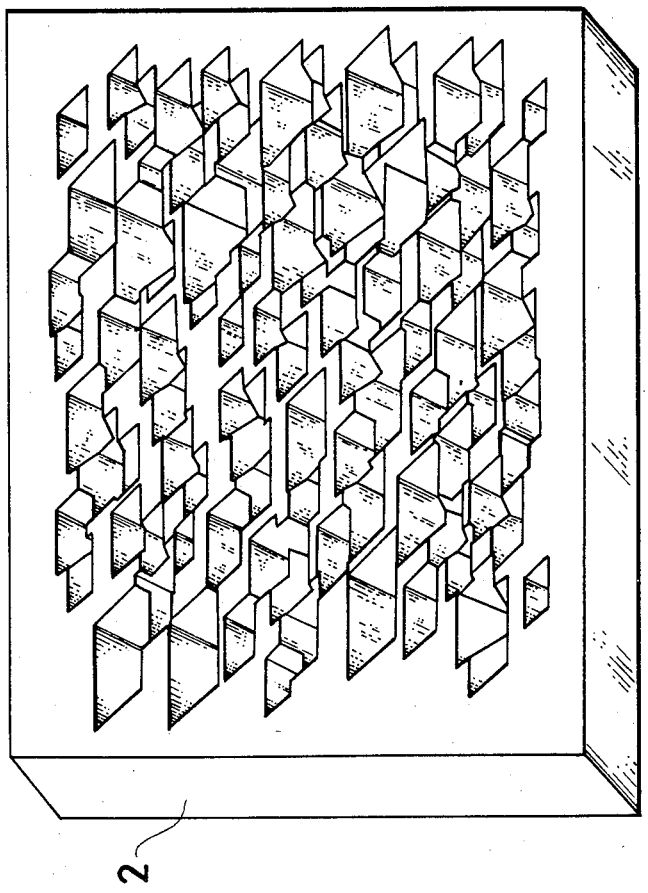
FIG. 2 is a perspective view of a substrate 2 according to one embodiment of the present invention.

By pressing a material in a softened state onto a surface of the original plate 1 shown in FIG. 1, a substrate 2 as shown in FIG. 2 is obtained. This substrate 2 is hardened to obtain the resultant substrate 2. A substrate having a large area may be obtained by arranging a large number of sheets of such substrates 2 side by side to obtain a required area.

Figure 3:
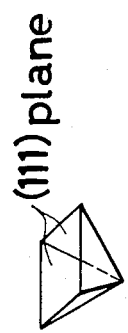
FIG. 3 is a schematic diagram showing one recess of the substrate 2 shown in FIG. 2.

The schematic diagram of FIG. 3 shows a recess of the substrate 2 of FIG. 2. Each of the four faces constituting such a quadrangular recess have the same symmetry of (111) plane in a cubic lattice, and the apex thereof is sharp.

By crystallizing semi-conductors and dielectric materials on the substrate 2 shown in FIG. 2 in the required thickness, a single crystal thin film may be obtained. For the deposition of the crystalline substance in the above case, there may be employed the vapor growth or vapor phase epitaxy method such as vapor deposition, chemical vapor deposition (CVD), molecular beam epitaxy and atomic beam epitaxy, or the so-called liquid growth or liquid phase epitaxy such as molten liquid growth method, solution growth method, etc.

The requirements for a material used in forming a substrate 2 are that:

(a) the material should withstand the high temperatures during formation of the single crystal onto the substrate 2, for example, at 500° to 1000° C.

(b) the material should be free from any deformation during hardening, even when hardened after having been pressed against the surface of the single crystal in the softened state, and should also have a sufficient strength in handling as the substrate 2.

(c) the material should be capable of correctly transferring the shape of pyramid (111) plane of the crystal surface to the replica, without any strain or distortion, and (d) the material should be inexpensive, etc.

For the materials of the substrate 2 as described above, for example, ceramics, graphite, etc. are suitable. For the ceramics, there may be employed those mainly composed, for example, of alumina ($Al_2O_3$), or of boron nitride BN, or of SiC, or a metal. Moreover, for the material of such substrate 2, glass or the like may be used.

The substrate 2 made of metal may be produced in the manner as described hereinbelow.

Figure 4:
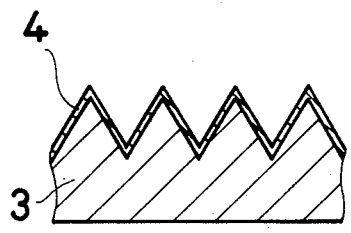
FIG. 4 is a sectional view showing a manufacturing method according to another embodiment of the present invention.
Figure 4:
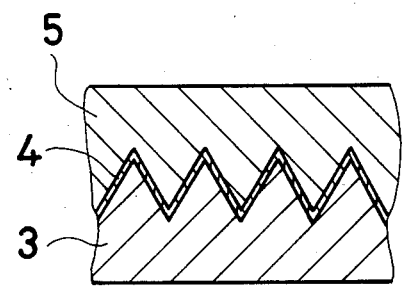
Figure 4:
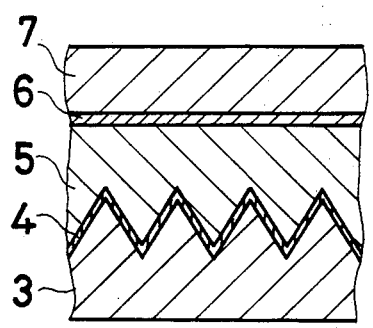
Figure 4:
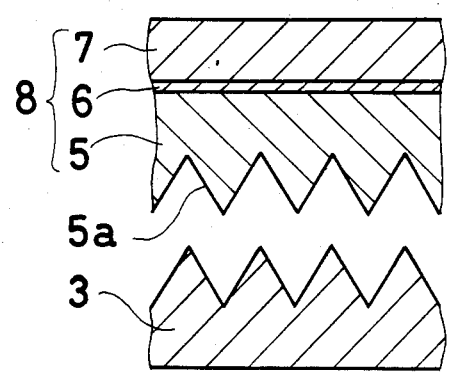

Referring to FIG. 4, metal is vapor-deposited on an original plate 3 to form a vapor deposition layer 4 as shown in FIG. 4 (1). This vapor deposition layer 4 is, for example, made of tin, zinc and the like. Subsequently, plating is effected with the vapor deposition layer 4 as an electrode as shown in FIG. 4 (2) to form a plated layer 5. This plated layer 5 may, for example, be made of nickel or the like. Thus, as shown in FIG. 4 (3), the plated layer 5 is brazed onto a base 7 by a brazing metal 6. For the brazing metal 6, metals such as gold, silver, etc. having high melting points and capable of withstanding the high temperatures during subsequent single crystal formation should be employed.

The base 7 may, for example, be stainless steel or the like. In the manner as described above, the surface relief of (111) plane symmetry formed on the surface of the original plate 3 is transferred onto the vapor deposition layer 4 and the plated layer 5. Then, the semi-finished product shown in FIG. 4 (3) is immersed in a melting solution for selectively melting the vapor deposition layer 4, whereby the vapor deposition layer 4 is melted, and the substrate 8 including the plated layer 5, brazing metal 6 and base 7 is obtained. For the melting solution, for example, hydrochloric acid may be employed when the vapor deposition layer 4 is made of tin.

As metals which may be used in place of ceramics, graphite or glass, there may be mentioned, for example, stainless steel, molybdenum, tungsten, platinum, etc.

As described above, the surface relief of (111) plane symmetry formed on the surface of the original plate 3 is transferred onto the surface 5a of the plated layer 5 for the replica, and through crystallization of semi-conductors and dielectric materials on the surface 5a of the plated layer 5, the single crystal thin film can be obtained.

The vapor deposition layer 4 may be made of gold and the like, or such vapor deposition layer 4 may be replaced by a plated layer 5 formed on the original plate 3. The original plate 3 has a different thermal expansion coefficient from the substrate which is the replica pattern obtained through vapor deposition or plating on the original plate 3, and it may be so arranged that the substrate 8 is detached from the original plate 3 through utilization of such difference in the thermal expansion coefficients.

When a large number of substrates 2 and 8 are manufactured with the use of the original plates 1 and 3, the original plates are gradually subject to deformation, destruction and abrasion, etc. To produce fresh original plates 1 and 3 requires troublesome procedures, with a consequent reduction in productivity of substrates 2 and 8.

In order to overcome the problems as described above, the productivity may be improved in the manner as described below according to the present invention.

Figure 5:
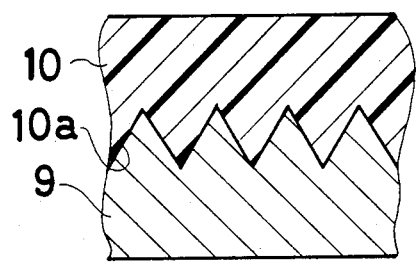
FIG. 5 is a sectional view showing a manufacturing method according to a further embodiment of the present invention.
Figure 5:
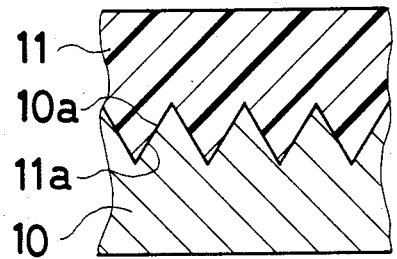
Figure 5:
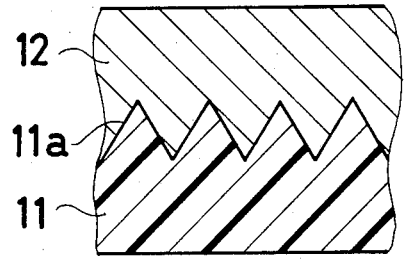
Figure 5:
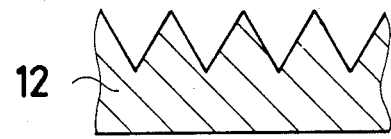

Referring to FIG. 5(1), the pyramidal surface similar to the original plate 1 is formed on a surface of the original plate 9 which is made of silicon single crystal. By pressing a thermosetting resin, for example, epoxy resin, etc. in a softened state against the surface of the original plate 9, a first substrate 10 is produced. The surface 10a of this first substrate 10 has the (111) plane symmetry of cubic lattice. Then, this first substrate 10 is hardened. Subsequently, as shown in FIG. 5(2), a thermosetting resin in the softened state is pressed against the surface 10a having the surface relief of (111) plane symmetry of the first substrate 10 to prepare a second substrate 11. Subsequently, this second substrate 11 is hardened. In this manner, on the second substrate 11, the surface having the same configuration as that of the original plate 9 may be transferred. In the next step, as shown in FIG. 5 (3), against the second substrate 11, a third substrate 12 in a softened state satisfying the conditions (a) to (d) above for the single crystal formation, is pressed. By hardening the softened substrate 12 thus obtained, a third substrate 12 as shown in FIG. 5 (4) is obtained. The third substrate 12 may be of ceramics, graphite or glass, etc. as described earlier, or may be manufactured in such a manner that, through vapor deposition or plating on the surface of the second substrate 11, the second substrate 11 is thereafter removed by heating or by chemicals. In the above practice, the third substrate 12 on which the single crystal film is formed may be produced in a large number of sheets by commonly employing the second substrate 11, and when this commonly used second substrate 11 is worn out, abraded, deformed or broken, its replacement may be produced again in a large number based on the first substrate 10. When, the first original plate 10 becomes unusable, such plate 10 may be reproduced from the original plate 9. In this manner, the number of reproduction of the first substrate 10, which is the replica from the original plate 9, may be reduced, and accordingly, the number of reproductions of the original plate 9 may also be decreased, with a consequent improvement of productivity.

According to the present invention, it may be so arranged that the second substrate 11 is produced by materials such as ceramics, graphite, glass and metals, etc. instead of the thermosetting resin, so as to form the single crystal on such second substrate 11.

Figure 6:
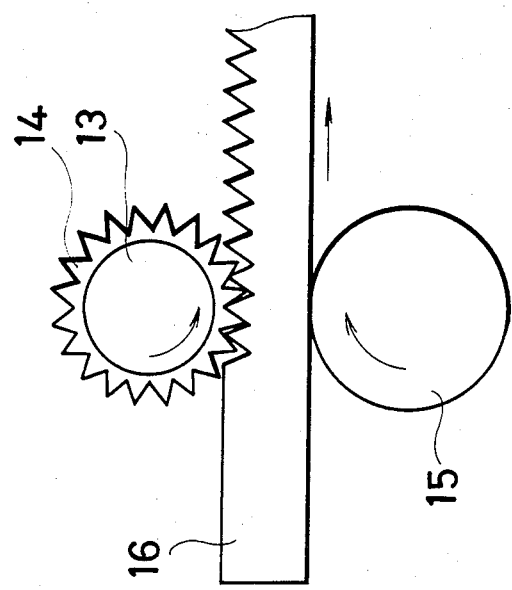
FIG. 6 is a side elevational view showing a manufacturing method according to still another embodiment of the present invention.

Instead of forming the large area single crystal thin film by arranging the substrates 2, 8, 10, 11 and 12 (collectively represented by reference numeral 14 hereinafter) thus obtained adjacent to each other on one flat plane, these substrates 14 may be pasted for fixing on a surface of a large straight cylindrical drum 13 as shown in FIG. 6. The material 16 in the softened state is inserted between the drums 13 and 15 during rotation thereof, whereby the surface relief having (111) plane symmetry formed on the surface of the substrate 14 is transferred onto the material 16, which may be used as the substrate.

The substrates 14 may be replaced by the silicon single crystal. The pyramidal structure of the silicon single crystal having the (111) plane is about 1 μm, for example, in its height, and therefore, in the external shape of the substrate 14 applied on the drum 13, the deformation of the (111) plane may be suppressed to such a range as it can be neglected by providing a diameter, for example, of 1 m.

In the foregoing embodiments, although silicon or the like is employed for the substrates 1 and 9, this may be replaced by other crystals, for example, rock crystals and the like.

Since the substrate 8 shown in FIG. 4 and the third substrate 12 shown in FIG. 5 are the replica of the pyramidal structure of the original plates 1, 3 and 9, there are recesses constituted by the faces having (111) plane symmetry of a cubic lattice. Since the bottom portions of the recesses of such substrates 2, 8 and 12 are sharp, there is a superior effect that the crystals readily grow as compared with the original plates 1, 3 and 9. Meanwhile, if these substrates 2, 8, 10, 11 and 12 are produced from materials having superior electrical insulation, it becomes possible to improve the electrical insulation among the functional elements of an integrated circuit employing the dielectric crystals formed on these substrates 2, 8, 10, 11 and 12 for further facilitation of integration at higher density. On the other hand, in the case where materials superior in heat conductivity are employed for the materials of such substrates 2, 8, 10, 11 and 12, it is possible to favorably effect heat dissipation of the integrated circuit, etc. employing semi-conductors formed thereon. Moreover, if these substrates 2, 8, 10, 11 and 12 are made of metal, they may be used as electrodes as they are, with consequent elimination of contact resistance. Furthermore, when inexpensive materials are used for these substrates 2, 8, 10, 11 and 12, with the single crystal being formed in a required thickness, extremely cheap integrated circuits, etc. may be realized. The crystals produced on the substrates thus formed by the replica may be, for example, semi-conductors such as GaAs, InSb, etc., and dielectric materials, for example, ferroelectric materials such as $PbTiO_3$, PLZT, etc.

In still another embodiment according to the present invention, the first substrate which is the replica of the single crystal cleavage plane is prepared by a material such as a synthetic resin, and the second substrate which is the replica of the first substrate is formed on the surface of the first substrate by a material such as a metal or the like through vapor deposition and plating, etc., and thereafter, the first substrate is washed away by a solvent.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description. All changes which come within the meaning and range of equivalency of the claims are therefore intended to be embraced therein.

What is claimed is:

1. A substrate for manufacturing single crystal thin films, characterized in that said substrate is a replica pattern of a single crystal cleavage plane, said replica pattern comprising a plurality of recesses in said substrate, said recesses having four faces which form an inverted quadrangular pyrmidal surface having a sharp apex and a height of about 1 $\mu$m, each of said faces having (111) plane symmetry of a cubic lattice, said replica pattern being prepared by pressing a first thermosetting resin in a softened state against the single crystal cleavage plane to form a first substrate of said first resin having, as a replica pattern of said single crystal cleavage plane, a first surface of (111) plane symmetry of a cubic lattice, hardening said first substrate, pressing a second thermosetting resin in a softened state against said first surface of said hardened first substrate to form a second substrate of said second resin having a second surface of the same configuration as said single crystal cleavage plane, hardening said second substrate, attaching a third material selected from the group consisting of ceramic, graphite and glass in a softened state against said second surface of said hardened second substrate to form a third substrate of said third material having, as a replica pattern of said second surface, a third surface of (111) plane symmetry of a cubic lattice, and hardening said third substrate.

2. A substrate as claimed in claim 1, which is fixed to the outside surface of a cylindrical drum.

* * * * *